(12) United States Patent
Buenaventura

(10) Patent No.: US 10,982,945 B2
(45) Date of Patent: Apr. 20, 2021

(54) MECHANICAL MAGNETIC PROXIMITY SENSOR DEVICE

(71) Applicant: Dynamic Security Consultation and Services, Hayward, CA (US)

(72) Inventor: Bryan Buenaventura, San Mateo, CA (US)

(73) Assignee: Spider Security Products, Hayward, CA (US)

( * ) Notice: Subject to any disclaimer, the term of this patent is extended or adjusted under 35 U.S.C. 154(b) by 99 days.

(21) Appl. No.: 16/429,023

(22) Filed: Jun. 2, 2019

(65) Prior Publication Data

US 2019/0368857 A1 Dec. 5, 2019

Related U.S. Application Data

(60) Provisional application No. 62/679,351, filed on Jun. 1, 2018.

(51) Int. Cl.
*G01B 7/14* (2006.01)

(52) U.S. Cl.
CPC ..................... *G01B 7/14* (2013.01)

(58) Field of Classification Search
CPC  G01D 5/145; G01D 5/12; G01D 5/16; G01D 5/165; G01D 5/24; G01D 5/2448; G01D 5/24485; G01D 5/24461; G01D 5/245; G01D 5/2452; G01D 5/2417; G01P 7/14; G01B 7/14; G08B 29/046; G08B 29/08
See application file for complete search history.

(56) References Cited

U.S. PATENT DOCUMENTS

| 5,475,996 | A | * | 12/1995 | Chen | ................... | E05B 47/0692 |
|  |  |  |  |  |  | 70/218 |
| 8,600,567 | B2 | * | 12/2013 | Copeland, II | ............. | E05F 1/08 |
|  |  |  |  |  |  | 700/282 |
| 9,268,356 | B2 | * | 2/2016 | Burleson | ................... | G05G 1/08 |
| 10,295,372 | B2 | * | 5/2019 | Kishi | ................... | G01D 11/245 |
| 2015/0113876 | A1 | * | 4/2015 | Burris | ................... | E05F 15/614 |
|  |  |  |  |  |  | 49/31 |
| 2017/0343383 | A1 | * | 11/2017 | Kishi | ................... | G01D 5/147 |

* cited by examiner

*Primary Examiner* — Thang X Le

(74) *Attorney, Agent, or Firm* — Indrajana Law Group, a PLC

(57) ABSTRACT

A sensor, comprised of various mechanical components and electromechanical components, that measures/detects the relative position between two (2) or more objects and can measure/detect relative acceleration of one (1) or more objects, using fundamental natural physical forces, e.g. magnetism, electrostatics. More particularly, this invention relates to a sensor that can measure/detect the relative position of two or more objects and/or measure/detect the acceleration of one or more objects. Specifically, this invention uses fundamental physical forces in combination with mechanical components to actuate electro-optical-mechanical signal devices, e.g. electrical switches, optical switches, magnetic switches.

10 Claims, 22 Drawing Sheets

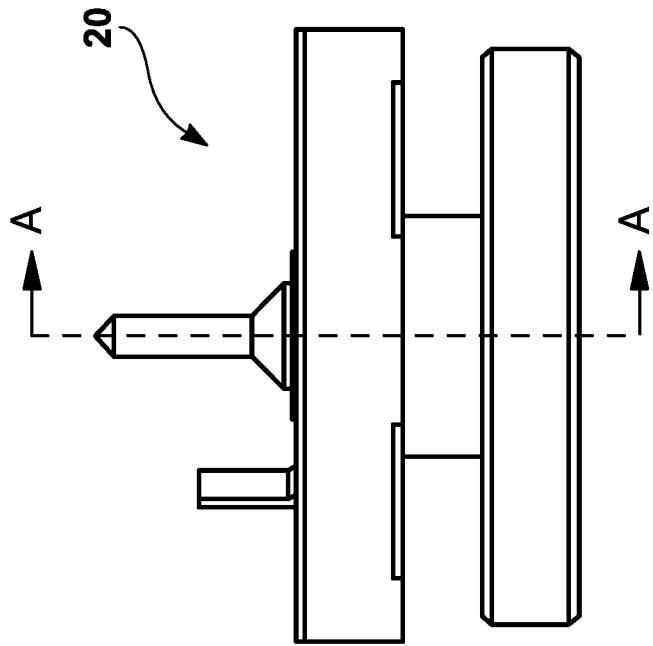
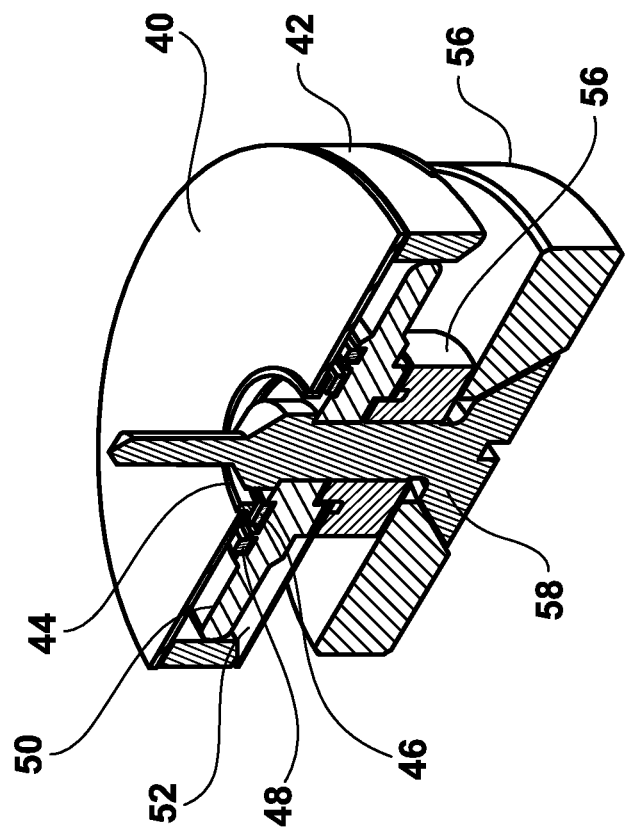
FIG. 7

MECHANICAL MAGNETIC PROXIMITY SENSOR DEVICE

CROSS REFERENCE TO RELATED APPLICATIONS

This Application claims priority to U.S. Provisional Patent Application No. 62/679,351 filed on Jun. 1, 2018.

STATEMENT REGARDING FEDERALLY SPONSORED RESEARCH AND DEVELOPMENT

None.

FIELD OF THE INVENTION

The present invention relates to a mechanical magnetic proximity sensor device, comprised of various mechanical components and electromechanical components, that measures/detects the relative position between two or more objects and can measure/detect relative acceleration of one or more objects, using fundamental natural physical forces, e.g. magnetism, electrostatics.

BACKGROUND OF THE INVENTION

The current state-of-the-art of proximity sensor is almost exclusively solid state or electronic. Little, if any, work has been done developing purely mechanical sensors that provide an interface with the physical world and even less work has been done developing mechanical sensors where the analysis is performed by mechanical means, not electronic. Magnetic or optical shaft encoders are examples of an electro-mechanical system that provides an interface between physical (radial) position and an electronic processing circuit that interprets the electro-mechanical output of the sensor. However, the mechanical components of such systems do not possess any ability process or analyze more nuanced inputs. There are totally enclosed/self-contained mechanical sensors that can process or analyze inputs from the physical worlds, e.g. seat belt latching mechanisms. Here inertia is sensed by a spring and a release member is engaged at a predetermined level. However, this type of system does not process nor communicate with components outside of its self-contained structure, thus allowing a self-contained system that minimizes the risk of outside interference or tampering attempts.

Another example of a purely mechanical sensor that process physical input and controls the function of another component is the automatic belt tracking system. Here, a belt, power transmission for example, moves out of alignment, thereby progressively triggering a mechanical response that returns said belt to proper alignment. The simplest form of a mechanical sensor is typified by the limit switch. Here, a switch element is depressed by mechanical engagement, thereby closing a set of electrical contacts. The equivalent is found in hydraulic/pneumatic systems where a valve (analogous to the limit switch) is actuated by mechanical engagement. In both of the previous examples, neither the switch or the valve process or analyze.

Thus, it is the objective of this invention to create a mechanical proximity sensor with the following capabilities:

1. A mechanical magnetic proximity sensor that functions on one or more fundamental physical forces, e.g. inertia, acceleration, magnesium, electrostatic potential;
2. A mechanical magnetic proximity sensor that functions in all orientations/positions, e.g. vertical, horizontal, skewed;
3. A mechanical magnetic proximity sensor that responds to one or more simultaneous directional inputs, e.g. simultaneous vertical input and horizontal input;
4. A mechanical magnetic proximity sensor that responds to one or more non-simultaneous directional inputs, e.g. non-simultaneous vertical input and horizontal input;
5. A mechanical magnetic proximity sensor that responds linearly to inputs;
6. A mechanical magnetic proximity sensor the responds non-linearly to inputs;
7. A mechanical magnetic proximity sensor that can independently process or react to one or more directional inputs;
8. A mechanical magnetic proximity sensor that can be scaled, sub-miniature to macro, i.e. manufactured using semiconductor technology and equipment up to sensors weighing 1,000-lbs or more;
9. A mechanical magnetic proximity sensor that can be easily field assembled/modified;
10. A mechanical magnetic proximity sensor that can be factory assembled in a hermetically sealed housing;
11. A mechanical magnetic proximity sensor that can function with reactive components, e.g. permanent magnets as an internal part of the sensor and non-reactive components external to the sensor;
12. A mechanical magnetic proximity sensor that can function with reactive components, e.g. permanent magnets as an internal part of the sensor and reactive components external to the sensor;
13. A mechanical magnetic proximity sensor that can function with non-reactive permeable materials, e.g. iron, cobalt-iron as an internal part of the sensor and reactive components external to the sensor.

In many applications, the relative position of two or more objects needs to be known. For example, in a possible embodiment, a security system needs to know if a door is properly closed or a machine tool has reached the limit of its programed travel. In both cases, reliability and dependability are of paramount concern. And, in many cases, the ability to reject extraneous inputs is also of great importance, especially when said external, extraneous input may be attributed to error or intentional tampering. In other cases, the opposite is true, such that the ability to detect and act on extraneous inputs is of primary concern. For example, a security sensor needs to be able to detect if a door is closed and at the same time detect if the sensor is being bypassed by an external (to the normal system) input, e.g. a magnet that can interfere and spoof the sensor.

In many applications, the absolute reliability of the sensor is of such paramount concern that signal processing must be performed mechanically. For example, a door security sensor must know (be able to determine) when a door is closed to a small fraction of an inch. A single limit switch can determine if the door has been closed but not when the door has traveled beyond its proper arc. And, any such limit switch requires physical contact between the door and the limit switch, leaving the system vulnerable to malfunction because of the environment or because of normal wear and tear and any such limit switch is particularly vulnerable to tampering.

Likewise, a material feed distribution system must know whether the feed hopper is in position correctly before discharging. Once again, limit switches frequently malfunction because of normal wear and tear or contamination from the operating environment. So clearly, a high degree of reliability demands a reliable NPS (Non-Contact Positioning).

In many applications, electronic sensors are too prone to external interference or vulnerable to tampering, now called 'hacking' or 'spoofing'. A simple mechanical proximity sensor that mechanically process physical information without using software or electronic elements is much less susceptible to tampering or external interference that an electronic sensor. And, in many applications, particularly in retro-fit applications for older sensor systems, the wiring for installing a new electronic sensor is typically not present and too costly to modify or change. For a two-wire system, electronic sensors may be prohibitively expensive. In contrast, a simple mechanical sensor can mechanically process inputs and close or open a set of electrical contacts using just a two-wire connection.

In other applications, a sensor needs to be able to detect or measure the relative position of two or more objects two planes, e.g. x-y plane and y-z plane. This amounts to detecting or measuring the position of an object in a 3-dimensional space. For example, a yoke pin must be centered over a hole as measured in the x-y plane and at the same time, the height of the yoke pin must be measured above the x-y plane or in the y-z plane or along the z-axis. A mechanical sensor then can generate two or more outputs based on the location of said yoke pin greatly simplifies monitoring.

SUMMARY OF THE INVENTION

In one possible embodiment of this invention, the relative position of two objects is detected and, when the objects are in a predetermined proximity, the sensor closes a set of electrical contacts.

A typical sensor will have its major components assembled on a core shaft. At one end of the core, a set of electrical contacts will be found. At the opposite end of the core a reactive component will be found, e.g. permanent magnet or a magnetically permeable material. In between the contacts and the reactive component will be found a spring designed to provide the require response when the sensor detects or senses object, magnetic or magnetically permeable material; thereby, indicating relative position.

In a possible embodiment, the mechanical magnetic proximity sensor device works in conjunction with a magnet piece to create a connection within the internal contact plates when the magnetic piece is within the range of the sensor magnet inside the sensor. When the magnetic piece is properly aligned within the range of the sensor magnet, the repulsive magnetic force will push the electrical contacts together and complete a circuit that will send a signal from the sensor to an external source like a monitoring device and such.

One common use scenario would be in the scenario of door sensors to determine whether a door is opened or closed in order to arm a building security system. However, in this scenario, a very common method to spoof traditional magnetic door sensors would be to introduce an external magnetic source that would allow the door to be opened but fool the sensor to think that the magnetic piece on the door is still within range and therefore the alarm would not be triggered.

In this case, the mechanical magnetic proximity sensor overcomes this potential weakness by implementing a mechanical mechanism that when an external magnetic force is introduced when the contacts are closed by the existing magnets, a fulcrum ring will react to the external magnetic force in a way that severs the contacts, which then can send a signal that the contact has been severed or an external tampering attempt has been detected.

BRIEF DESCRIPTION OF THE DRAWINGS

FIG. 7 is a cross-section, isometric perspective of the mechanical magnetic proximity sensor in accordance with the present invention.

NUMERAL REFERENCE INDEX

20—Mechanical proximity sensor
30—Magnetic piece
32—Detection envelope
34—External magnetic object
40—Contact plate
42—Spring cage
44—Upper contact insert
46—Lower contact insert
48—Fulcrum ring
50—Ring carrier
52—Contact spring
54—Coaxial retainer
56—Sensor magnet
58—Core shaft
60—Detection envelope
62—Permanent magnet(s)
64—Slide
66—Carriage
68—Bypass magnet/External Magnetic Object

DETAILED DESCRIPTION OF THE INVENTION

Figure 1:
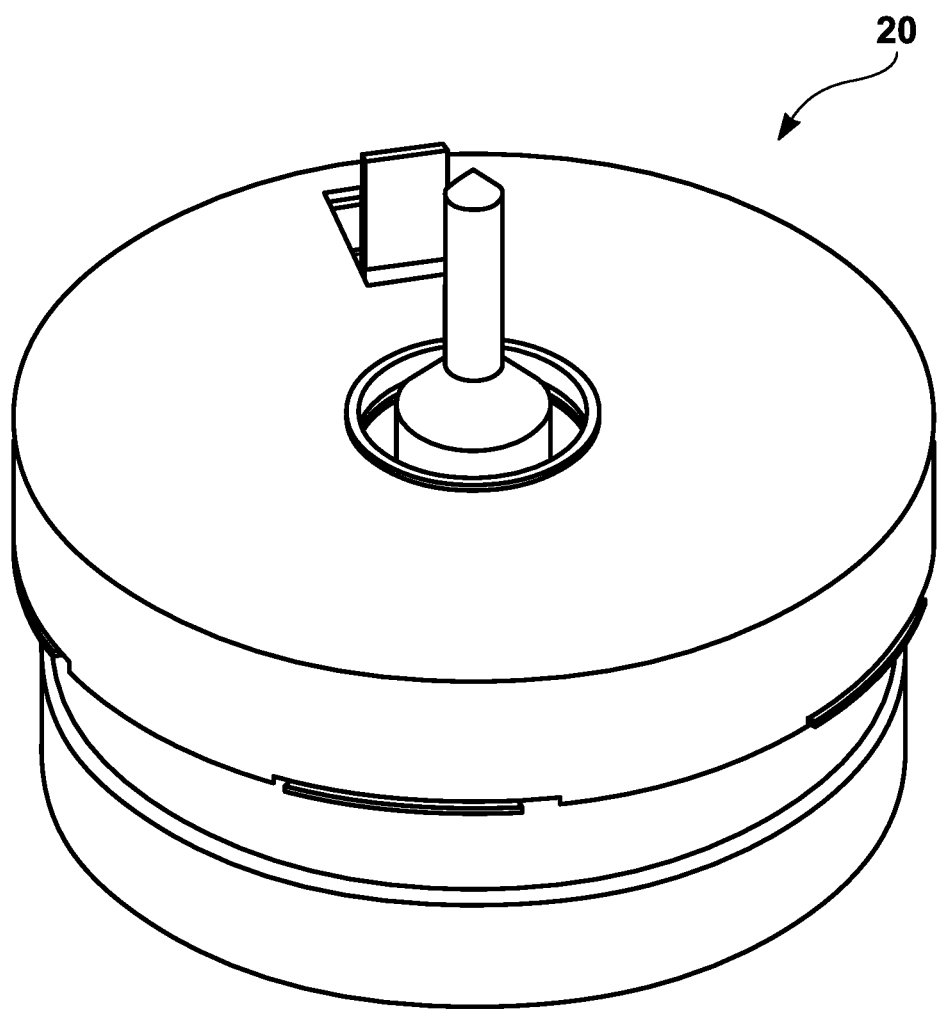
FIG. 1 is an overall top-view perspective of a mechanical magnetic proximity sensor in accordance with the present invention.
Figure 2:
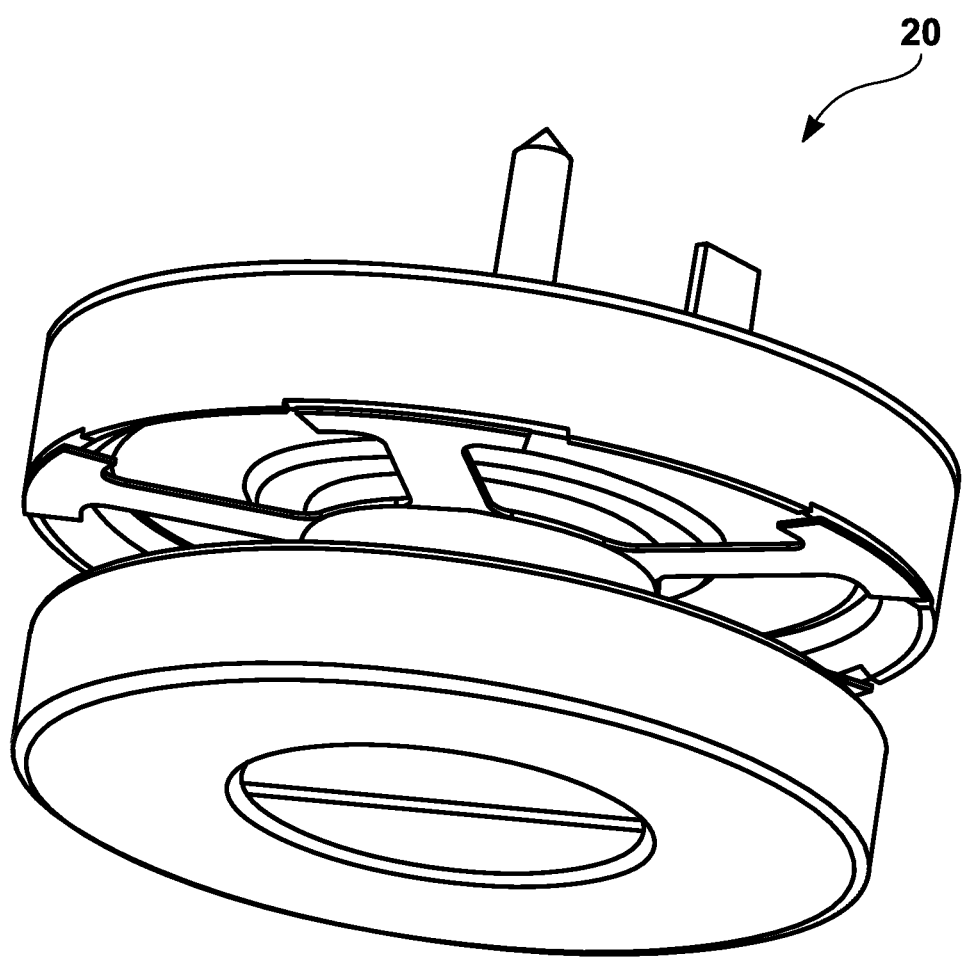
FIG. 2 is an overall bottom-view perspective of a mechanical magnetic proximity sensor in accordance with the present invention.
Figure 3:
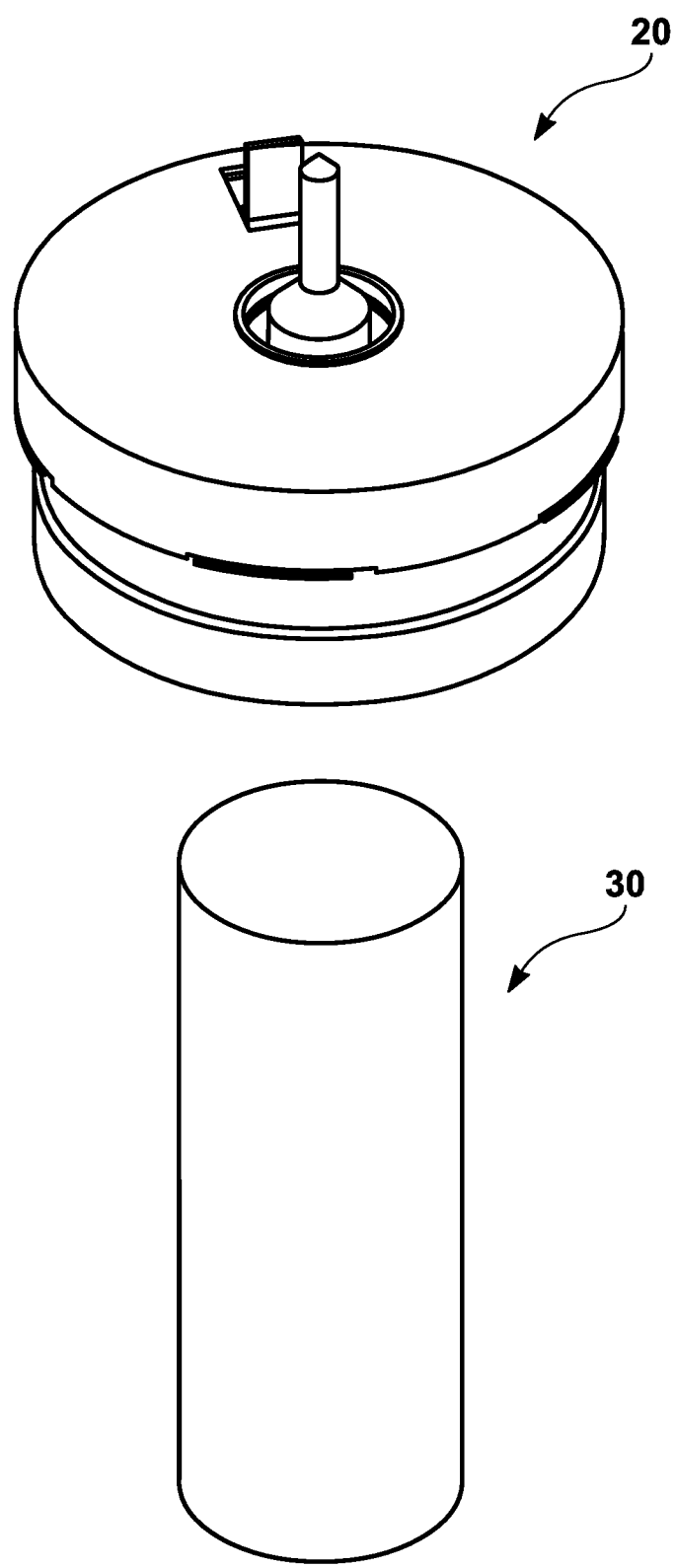
FIG. 3 is a perspective of the mechanical magnetic proximity sensor and the magnetic piece being sensed or detected in accordance with the present invention.

A mechanical proximity sensor assembly 20 as shown in FIG. 1 and FIG. 2. The sensor can sense or detect the relative position of two magnetic objects (the sensor 20 and the magnetic piece 30) as shown in FIG. 3. To further clarify, this mechanical magnetic proximity sensor can sense or detect an object in proximity to the sensor 20; thereby, establishing the relative position of the magnetic piece 30 to the sensor 20.

Figure 4:
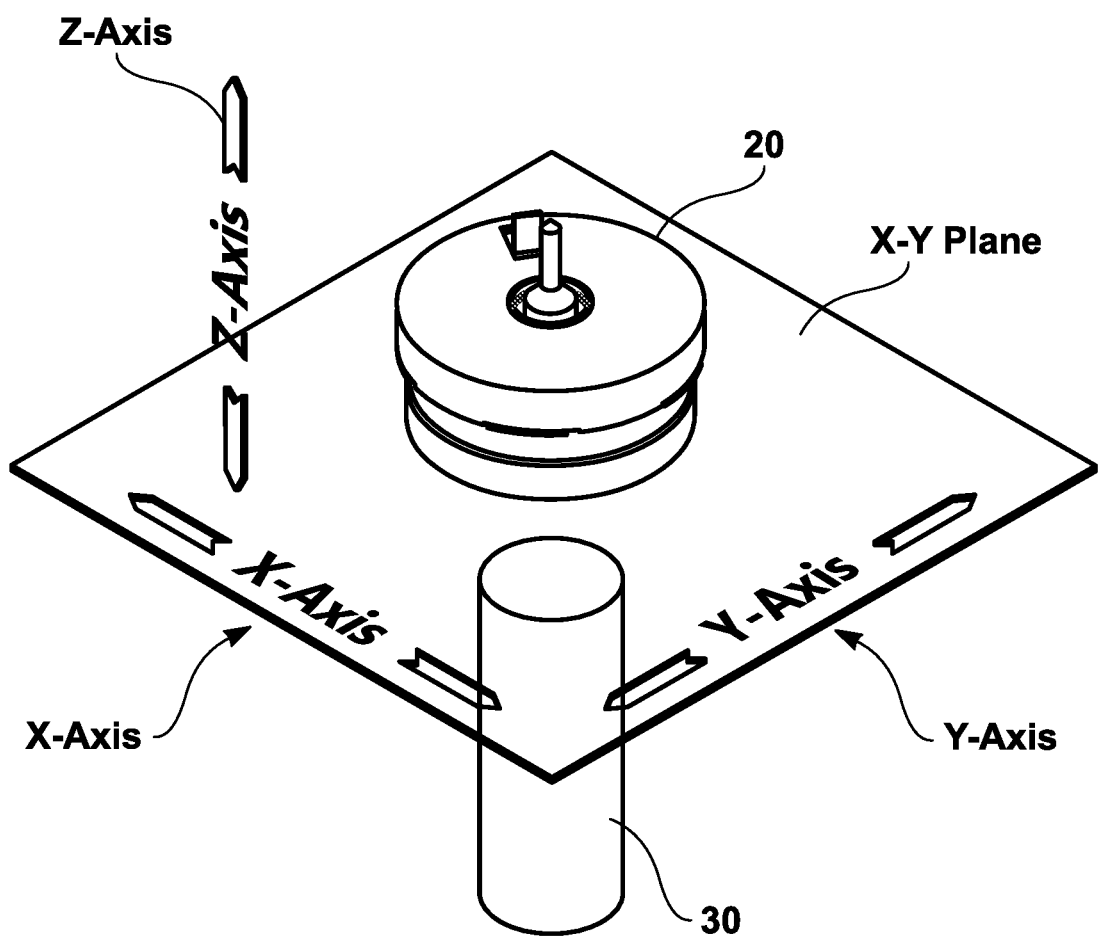
FIG. 4 is a perspective of the mechanical magnetic proximity sensor and the magnetic piece imposed in a three-dimensional coordinate system.

The detection envelope is defined as a three-dimensional magnetic field and can be described in a standard coordinate system composed of the X-Y plane and the Z axis perpendicular to the X-Y plane, as shown in FIG. 4. Any magnetic piece 30 within the detection envelope will cause the sensor to close a set of electro-mechanical contacts, permitting electrical current to flow in an external circuit.

Figure 5A:
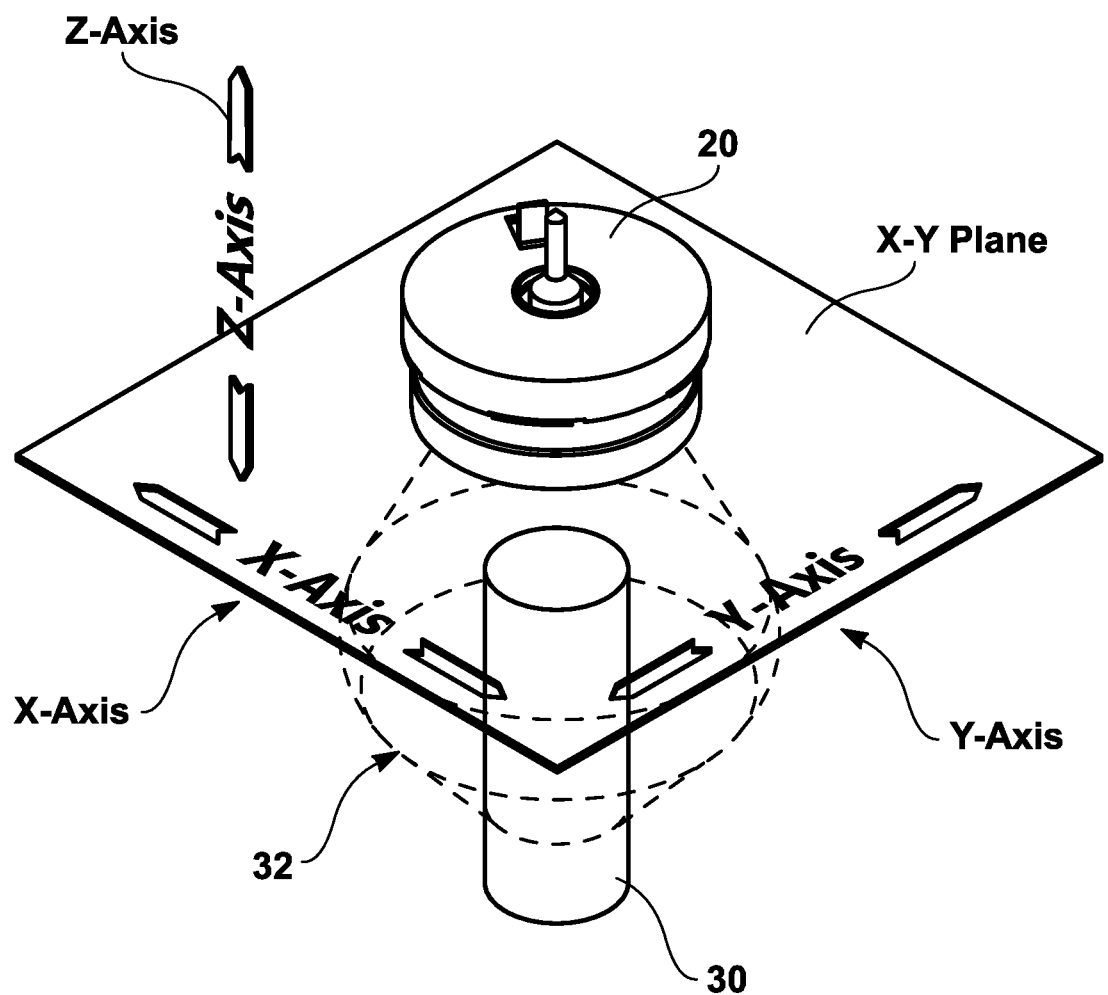
FIG. 5A is a perspective of the mechanical magnetic proximity sensor and the magnetic piece and the 3-Dimensional Detection Envelope.
Figure 5B:
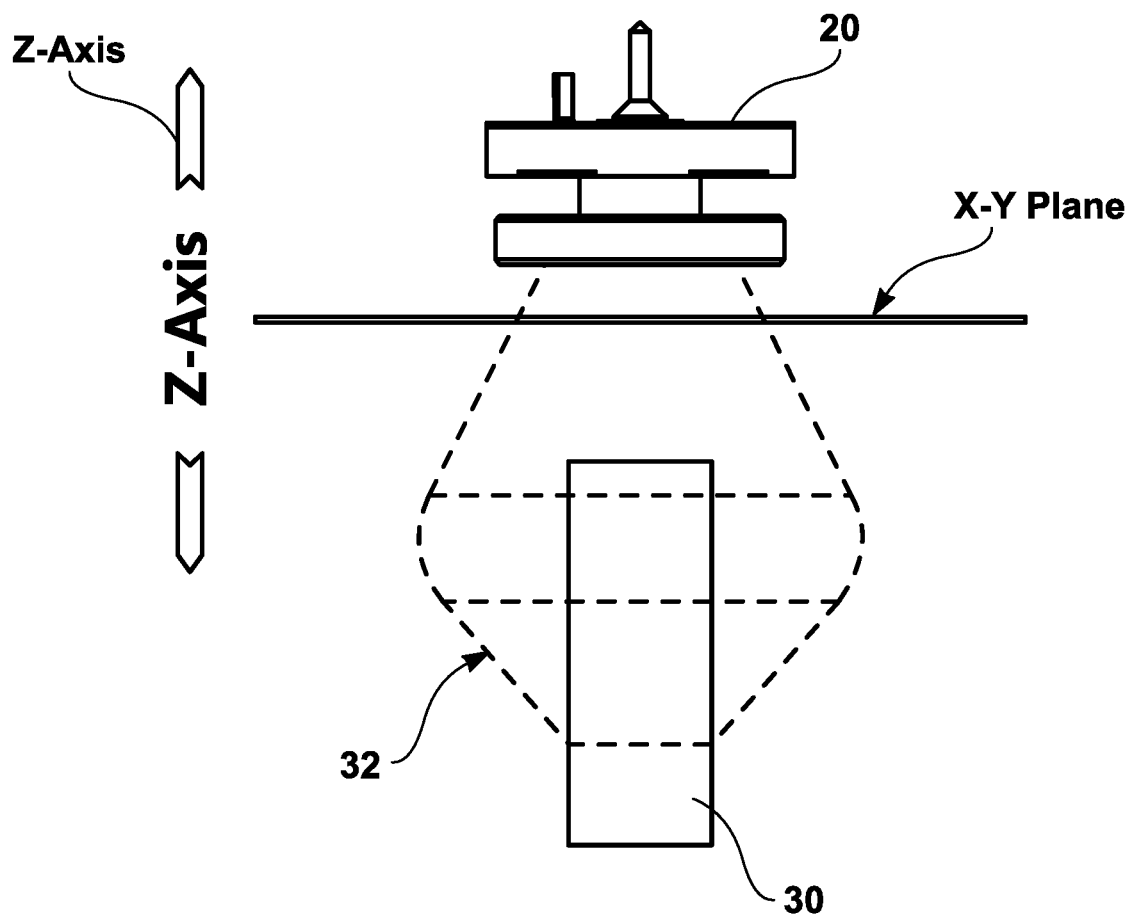
FIG. 5B is a side view of the mechanical magnetic proximity sensor and the magnetic piece and the 3-Dimensional Detection Envelope.

The shape of the detection envelope is that of a truncated cone, as shown in FIGS. 5A and 5B. The shape of the cone is determined or set by the internal components of the sensor. The size or extents of the cone depends on the interaction of the fundamental force being employed by the sensor 20, e.g. magnetism and the magnetic piece 30.

Figures 6A, 6B:
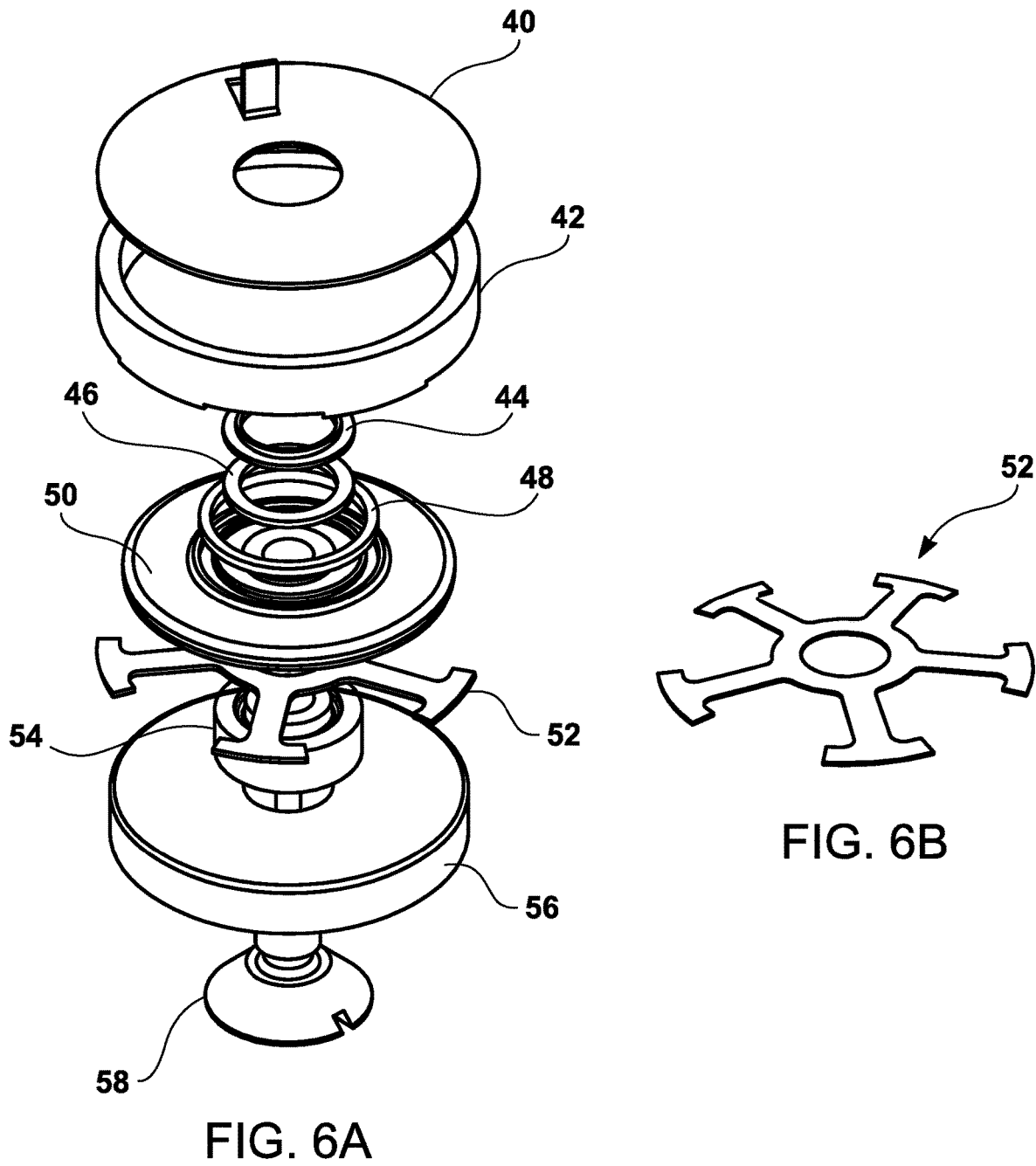
FIG. 6A is an isometric perspective, exploded view, of the mechanical magnetic proximity sensor in accordance with the present invention.
FIG. 6B is a view of the contact spring.

FIG. 6A is an exploded view of the mechanical magnetic proximity sensor referencing each part in the sensor assembly 20, with FIG. 7 showing a cross-section isometric view of the sensor assembly. The components of the sensor are assembled on the core shaft 58. The core shaft 58 is preferably made from a non-magnetic material but at the same time provides good conductivity to allow electrical connection flowing throughout the sensor parts. The tip of the core shaft 58 can be connected to one of a two-wire electrical connection, with the other wire connected to the contact plate 40. From bottom to top, a sensor magnet 56 is located above the base of the core shaft 58. A coaxial retainer 54 is provided above the sensor magnet. The entire assembly 20 is suspended and held in place (fixed position) by the contact spring 52. The contact spring 52 is in turn held in place (fixed position) by the spring cage 42. The contact spring 52 imparts a gimbal motion or action to the entire sensor assembly 20. Specifically, the contact spring 52 is made of a flexible material that allows it to flex within the space between the sensor magnet 56 and the ring carrier 50, of which the space is defined by the size of the coaxial retainer 54. Without the coaxial retainer, the contact spring would not have the room or space to flex and impart the gimbal action or action to the entire sensor assembly.

In one possible embodiment, the ring carrier 50 holds a fulcrum ring 48 and the upper contact insert 44 and the lower contact insert 46 arranged in a concentric circle housed inside the spring cage 42, with the contact plate 40 placed on top of the spring cage 42.

Still another unique feature of this sensor is that the shape of the truncated cone detection envelope and the toroid/torus detection envelope can be modified to be more sensitive in one direction or less sensitive in one direction. This modification is achieved by altering the shape of the contact spring 32 as seen in FIG. 6B. A typical contact spring 32 has its arms equally spaced—the same number of degrees apart, e.g. 72-degrees for a five-arm contact spring. Now, if the spacing of the contact spring arms is changed so that some arms are closer together and other arms are further apart, the detection envelopes will no longer be symmetrical about the Z-axis. The shape of the contact spring can be modified to accommodate different functions of sensor/detection capabilities as needed.

It is understood that this simplest embodiment of the present invention can and will function with the following matrix of components;
  i. Where the sensor magnet 56 is a magnet and the magnetic piece 30 is a magnet;
  ii. Where the sensor magnet 56 is a magnet and the magnetic piece 30 is a ferromagnetic material;
  iii. Where the sensor magnet 56 is a ferromagnetic material and the magnetic piece 30 is a magnet;
  iv. Where either or both the sensor magnet 56 and the magnetic piece 30 are electromagnets;
  v. Other fundamental physical forces, e.g. electrostatic forces.

Figure 8:
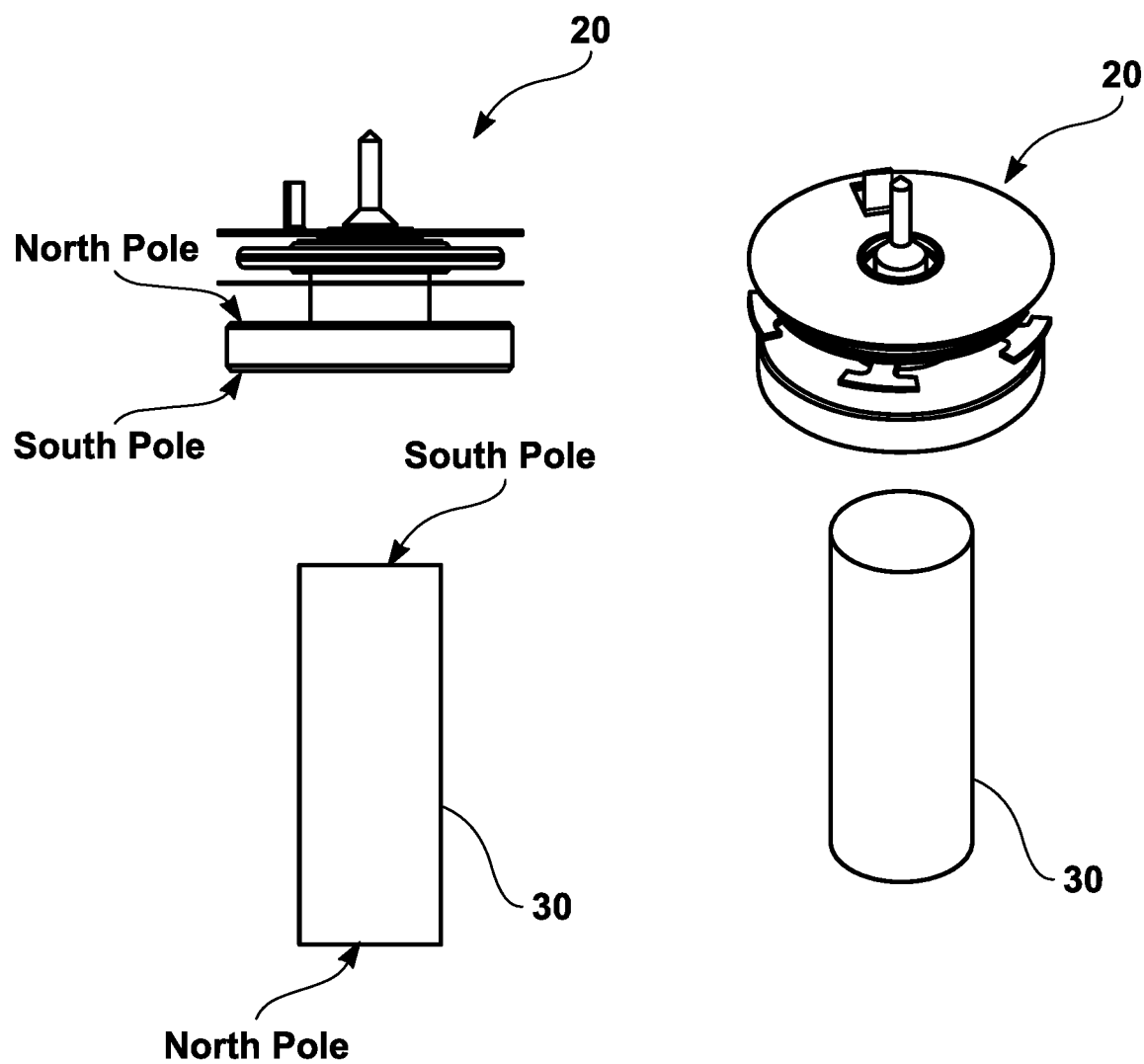
FIG. 8 is a front view and isometric view of the mechanical magnetic proximity sensor and the magnetic piece showing the arrangement of the internal and external components in accordance with the present invention.

In a normal use scenario of a possible embodiment, the sensor magnet 56 and the magnetic piece 30 will be oriented as shown in FIG. 8, where the poles of sensor magnet 56 and magnetic piece 30 are configured to create a repulsive magnetic force between one another. As the magnetic piece 30 approaches the sensor 20 and reaches any point inside the Detection Envelope 32, the repulsive force between the magnets will cause the contact spring 52 to deflect, closing the gap between upper contact insert 44 and lower contact insert 46, thereby completing the external electrical circuit, allowing the current to flow and establishing the relative position of the sensor 20 and the magnetic piece 30.

Figure 9:
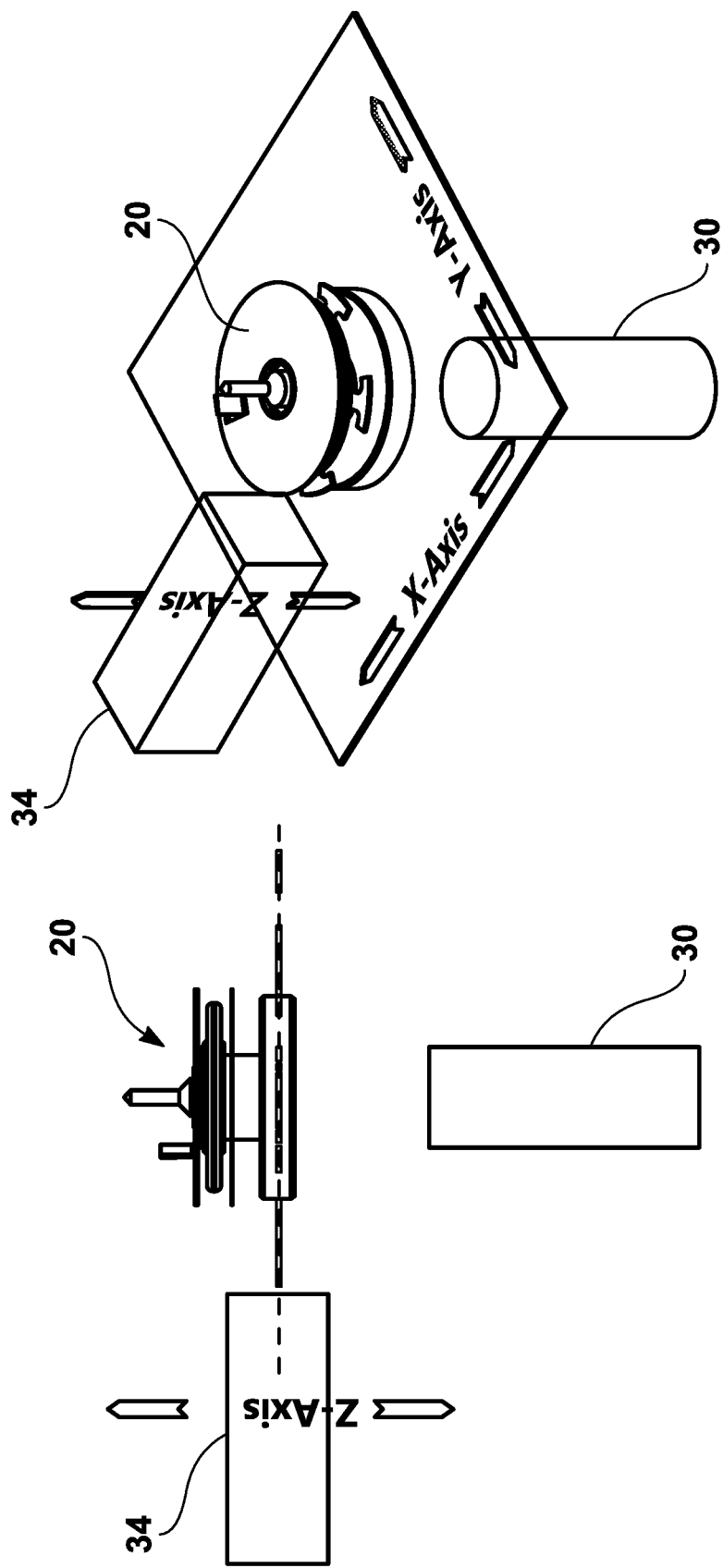
FIG. 9 is a front view and isometric perspective of the mechanical magnetic proximity sensor, magnetic piece and an external magnetic object showing the mechanical magnetic proximity sensor and two separate magnetic objects interacting in accordance with the present invention.

A key embodiment of the present invention is the ability to respond to two or more simultaneous inputs—the normal input caused by the magnetic piece 30 and another input by an external magnetic object 34 as shown in FIG. 9.

With reference to FIG. 9, in which an external magnetic object 34 is introduced to interfere with the normal use, i.e. the external magnetic object is used to overcome or spoof the sensor to think that the magnetic piece 30 is still within the detection envelope when in reality the magnetic piece 30 has moved away from the detection envelope and the connection should have been severed.

When an external magnetic object 34 approaches the sensor 20, an interaction will occur between the internal magnetic piece 56 and external magnetic object 34. The external magnetic object 34 will create a magnetic interaction such that if the external magnetic force is strong enough, it will trigger a safety mechanism within the sensor to disengage the contacts to indicate an external interference to the sensor system. Now, if the magnetic piece 30 is within the detection envelope of the sensor 32, the upper contact insert 44 and lower contact insert 46 will be closed, that is to say, the upper contact insert 44 and lower contact insert 46 will be in physical contact causing the external electrical circuit to be completed. As the external magnetic object 34 approaches the sensor magnet 56, the strength of the interaction between the external magnetic object 34 and the sensor magnet 56 will increase. This in turn will cause the sensor assembly 20 to gimbal or lean either towards the external magnetic object 34 or away from it. As the sensor assembly 20 gimbals or leans further due to the magnetic interactions, the fulcrum ring 48 will come in contact with the bottom of contact plate 40. At this point, the Core Shaft 58 and the Fulcrum Ring 48 form a classic lever and fulcrum configuration. As the external magnetic object 34 continues to approach the sensor magnet 56, a point will be reached where the mechanical advantage of the lever and fulcrum configuration will cause the Upper Contact Insert 44 and Lower Contact Insert 46 to separate—to break the electrical circuit existing with upper contact insert 44 and the lower contact insert 46. Thus, the sensor 20 is able to respond to two simultaneous inputs/forces.

Figure 10:
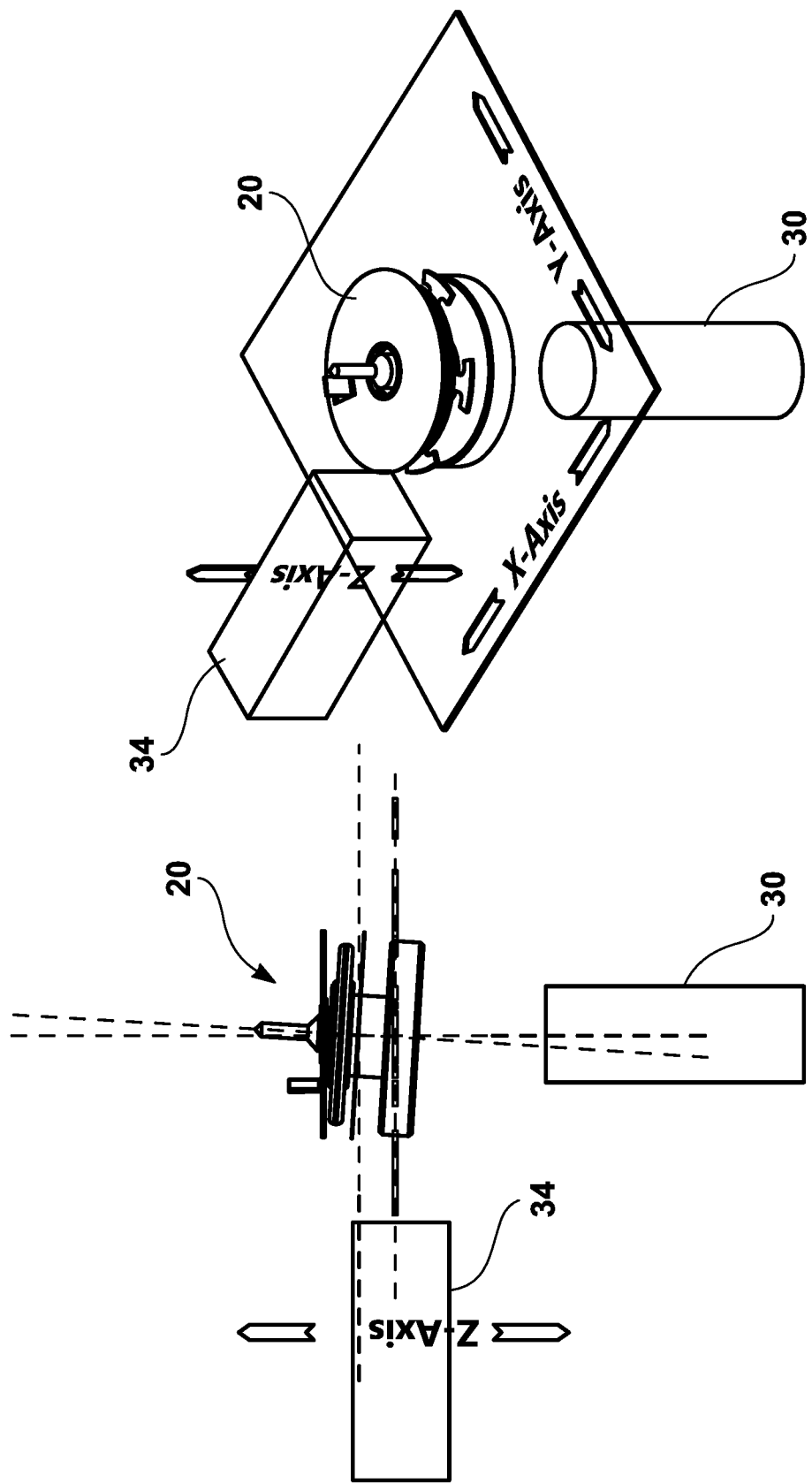
FIG. 10 is a front view and isometric perspective of the mechanical magnetic proximity sensor, magnetic piece and an external magnetic source showing the mechanical magnetic proximity sensor reacting or responding to magnetic piece and simultaneously reacting or responding to an external magnetic source in accordance with the present invention.
Figure 11:
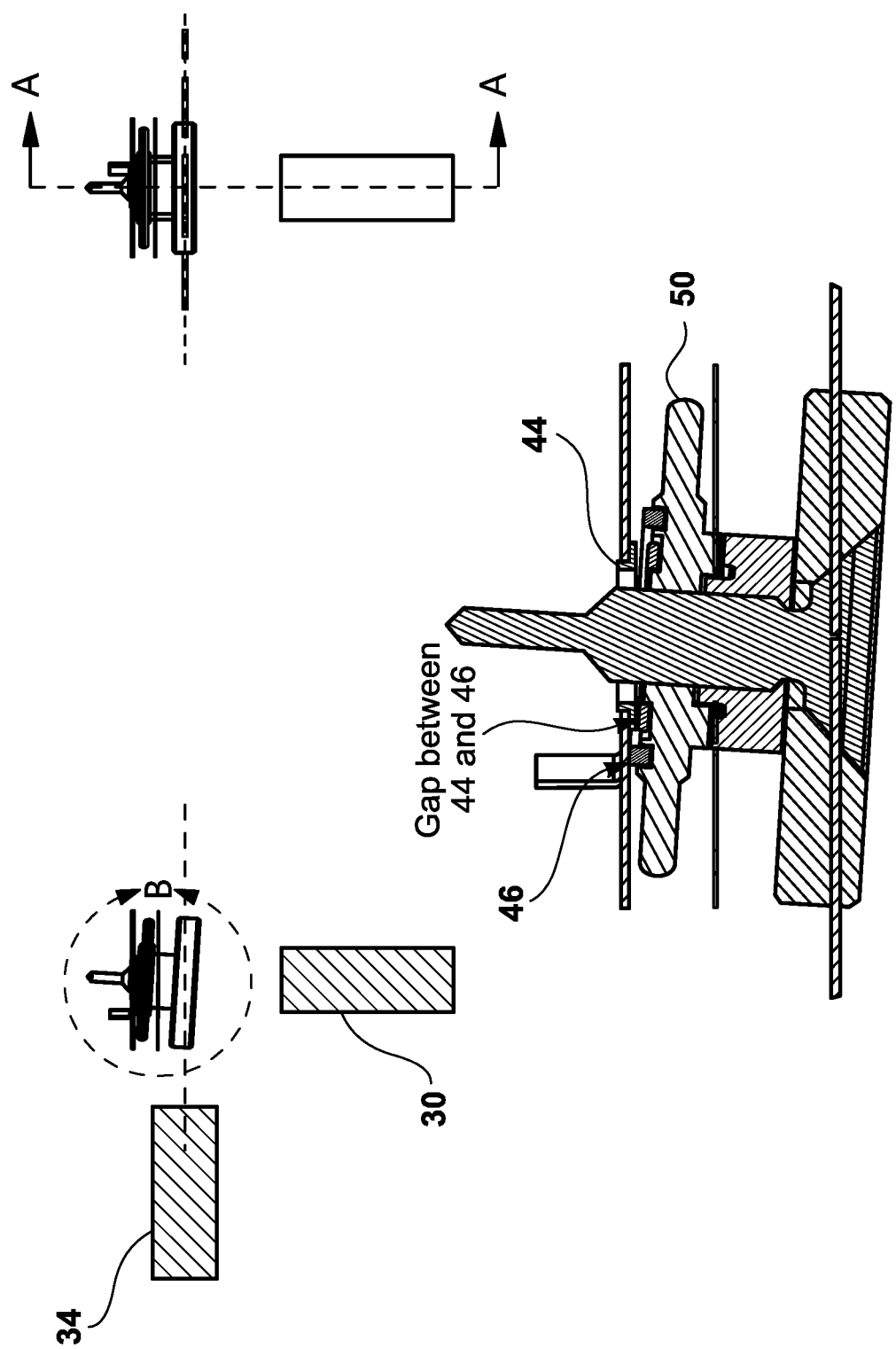
FIG. 11 is a front view and enlarged cross-section view of the mechanical magnetic proximity sensor, magnetic piece and an external magnetic object showing the internal function of the mechanical magnetic proximity sensor reacting or responding to magnetic piece in accordance with the present invention.

FIG. 10 shows a cross-section of sensor 20 with the Core Shaft 58 gimbaled to one side, opening Upper Contact Insert 44 and Lower Contact Insert 46 in a situation where an external magnetic object 34 is introduced. FIG. 11 shows an enlarged cross-section of sensor 20 with the Core Shaft 58 gimbaled/tilted to one side, opening Upper Contact Insert 44 and Lower Contact Insert 46 in a situation where an external magnetic object 34 is introduced.

Figure 12:
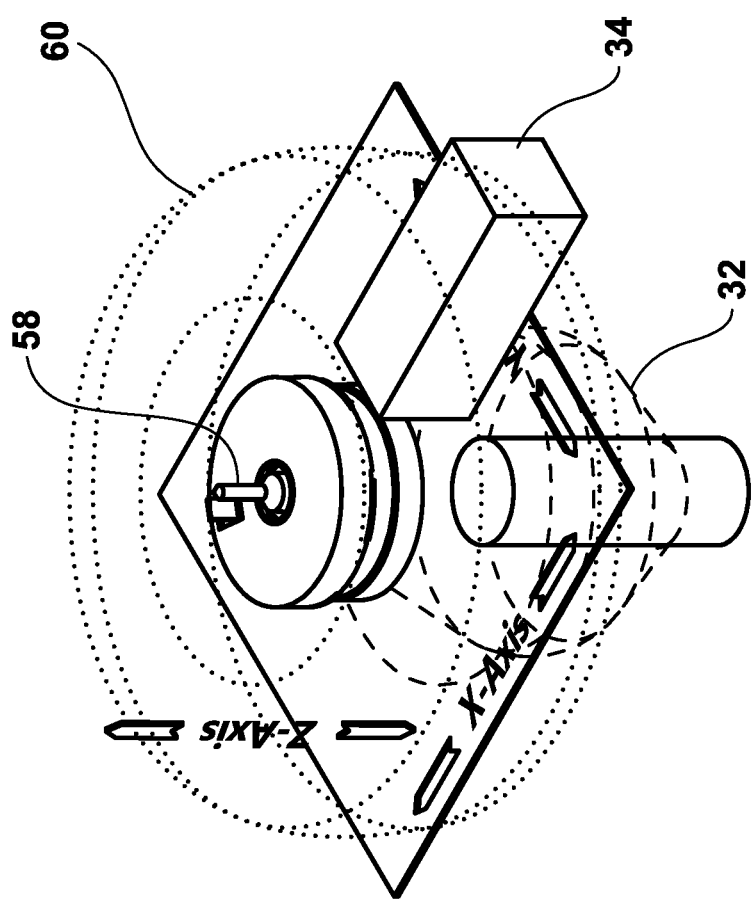
FIG. 12 is an isometric view of the mechanical magnetic proximity sensor and the torus detection envelope formed by the lever and fulcrum configuration in accordance with the present invention.
Figure 13:
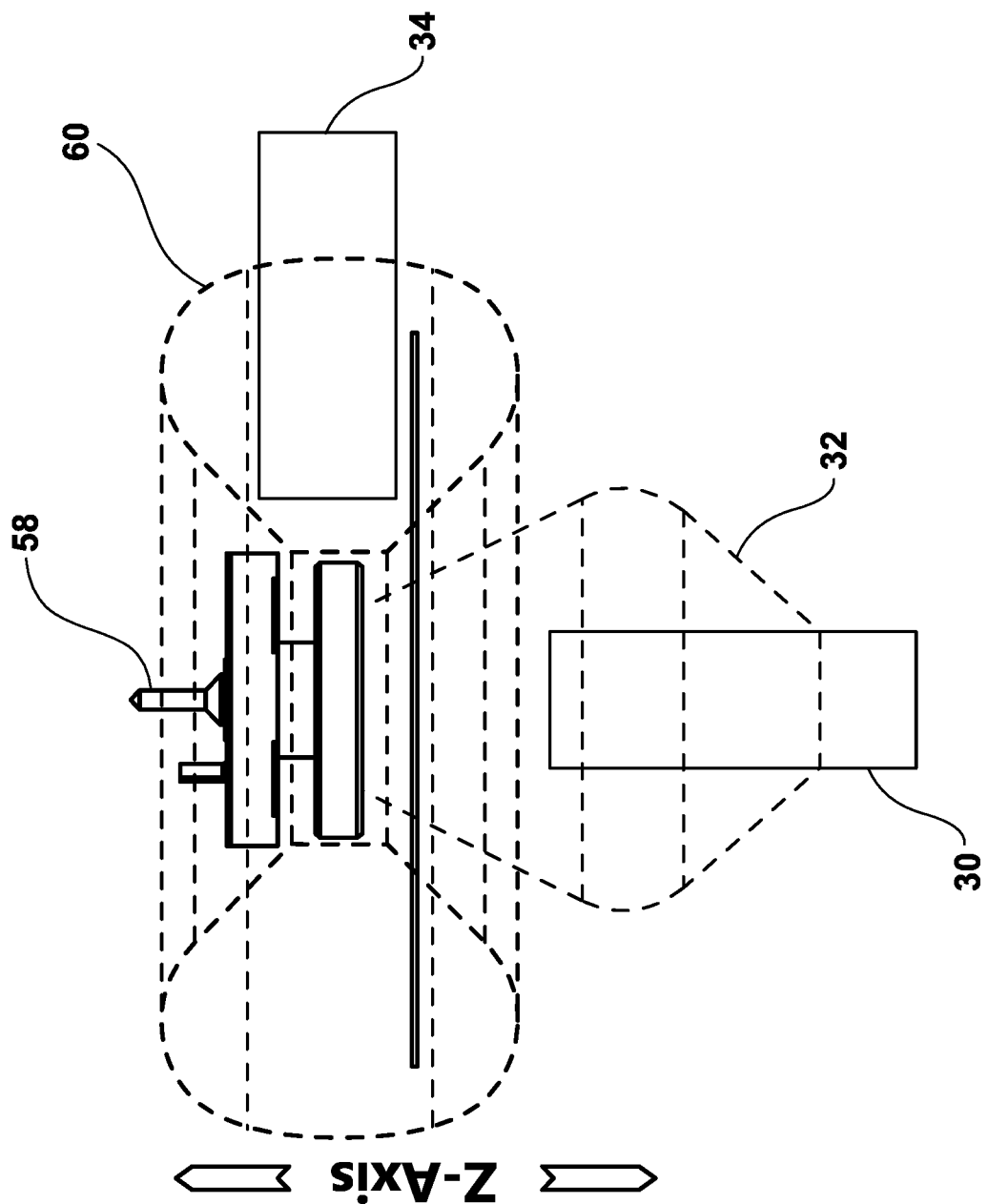
FIG. 13 is a front view of the mechanical magnetic proximity sensor and the torus detection envelope formed by the lever and fulcrum configuration in accordance with the present invention.

Previous mention is made of the detection envelope 32 shown in FIGS. 5-A and 5-B. The lever and fulcrum configuration create a detection envelope for objects approaching the sensor perpendicular to the Core Shaft 58. This detection envelope takes the approximate form of a toroid/torus 60 as illustrated in FIG. 12 and FIG. 13. Objects approaching the sensor within the detection envelope 60 will trigger the lever and fulcrum configuration and open the Upper Contact Insert 44 and the Lower Contact Insert 46.

To better understand the possible use scenarios for the mechanical magnetic proximity sensor device 20, two practical examples are provided. The first example shows the sensor used as a "home" position detector/indicator and as an over-travel sensor/indicator in a machine tool carriage and slide. The second example shows the sensor used in a security system to detect if a door is open or closed and to detect attempts to bypass/defect the sensor.

Figure 14:
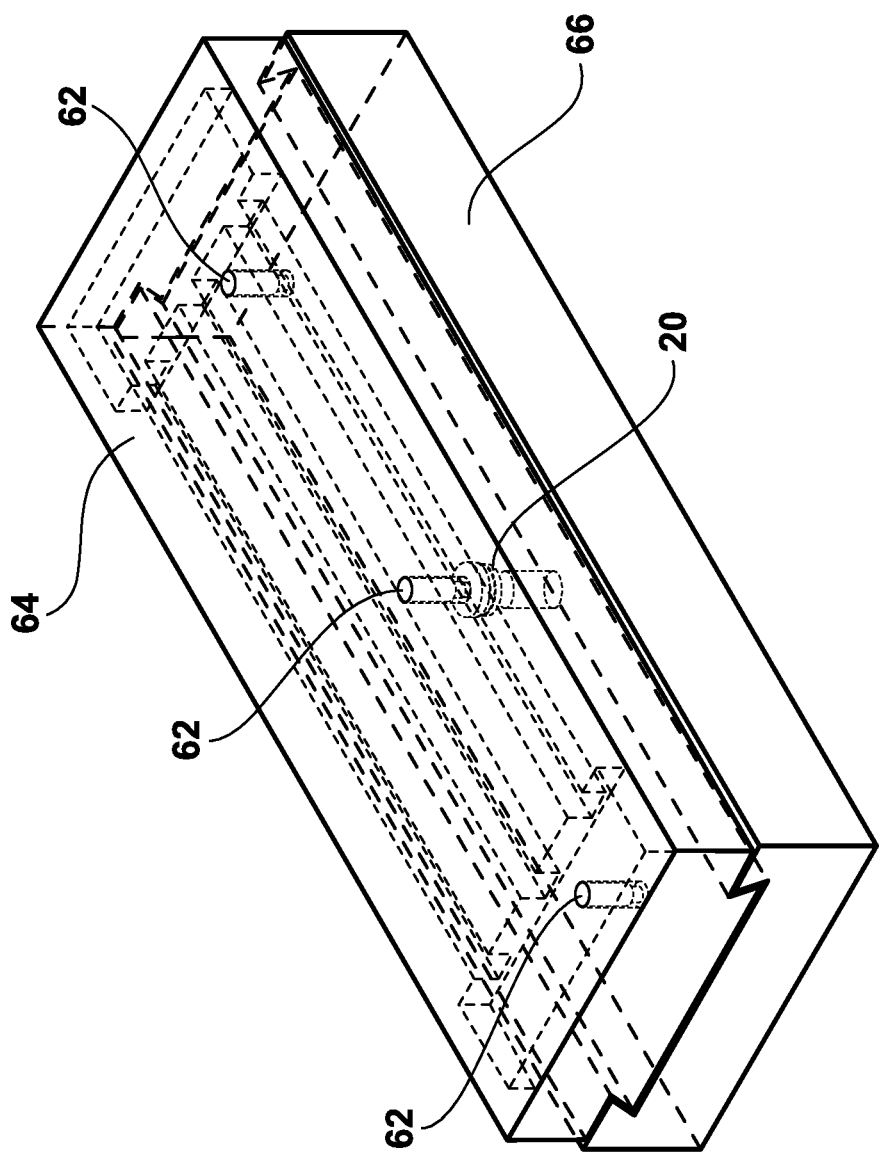
FIG. 14 is a see-through isometric view of the sensor used as a home position indicator and over-travel indicator, shown in the home position, in accordance with the present invention.

FIG. 14 shows a see-through view of the machine tool carriage 66 and slide 64. The slide 64 is shown in the home (centered) position. The sensor 20 is directly under permanent magnet 62. The contacts of the sensor are closed, signaling the machine tool controller that the slide 64 is in the home position.

Figure 15:
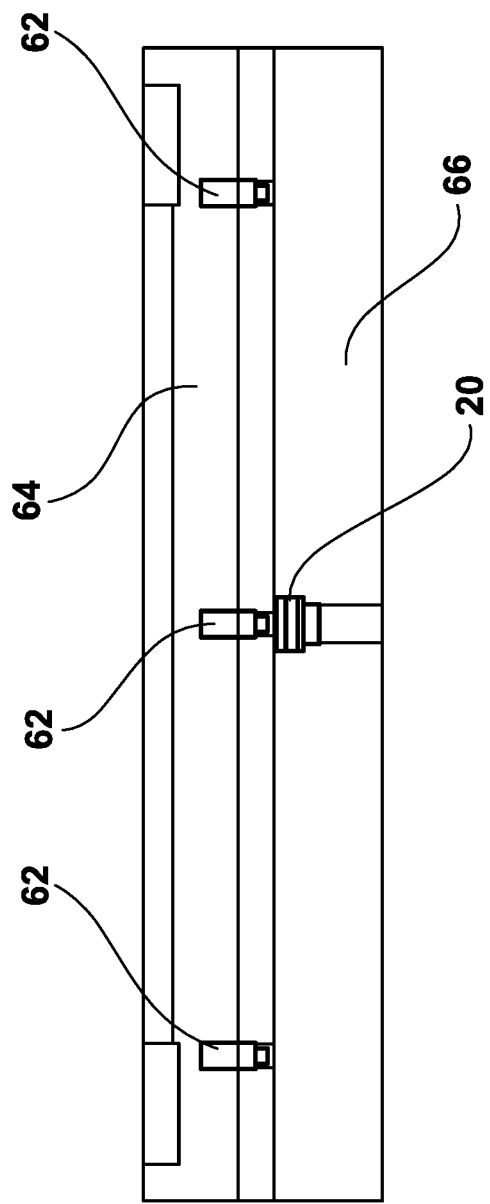
FIG. 15 is a see-through front view of the mechanical magnetic proximity sensor used as a home position indicator and over-travel indicator, shown in the home position, in accordance with the present invention.

FIG. 15 shows a see-through view of the machine tool carriage 66 and slide 64. The slide 64 is shown in the hone (centered) position. The sensor 20 is directly under permanent magnet 62. The contacts of the sensor are closed, signaling the machine tool controller that the slide 64 is in the home position. The over-travel magnets can be seen on either side of the home position in the center of the carriage 66 and slide 64.

Figure 16:
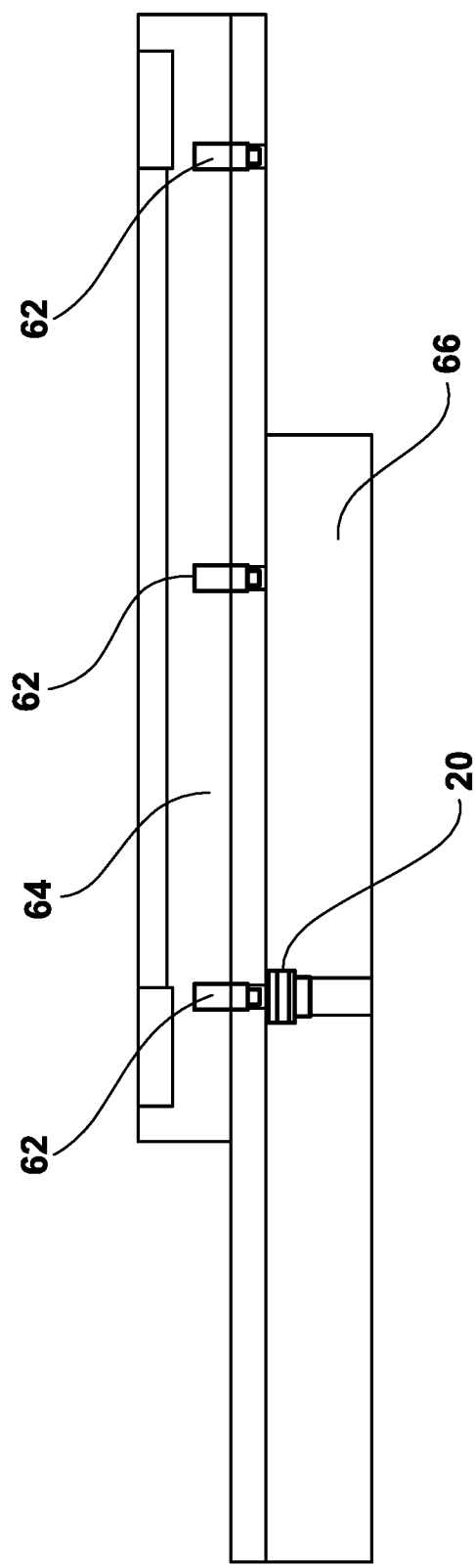
FIG. 16 is a see-through front view of the mechanical magnetic proximity sensor used as a home position indicator and over-travel indicator, shown in the over-travel position, in accordance with the present invention.

FIG. 16 shows as see-through view of the machine tool carriage 66 and slide 64. The slide 64 is shown in the over-travel position. The sensor 20 is directly under permanent magnet 62. The contacts of the sensor are closed, signaling the machine tool controller that the slide 64 has reached an over-travel position. The over-travel magnets are symmetrical with respect to the home position at the center of the slide 64 and the sensor 20. This allows the controller to receive an input signal for over-travel to either side of the home (center) position.

In another use case, to help better understand one possible use scenario of the mechanical magnetic proximity sensor device, has the device installed in a security application to indicate/detect if a door is open or closed. And, taking advantage of the key embodiment, the ability to detect two or more simultaneous inputs, the device can detect an attempt to bypass the sensor with an external magnet.

Figure 17:
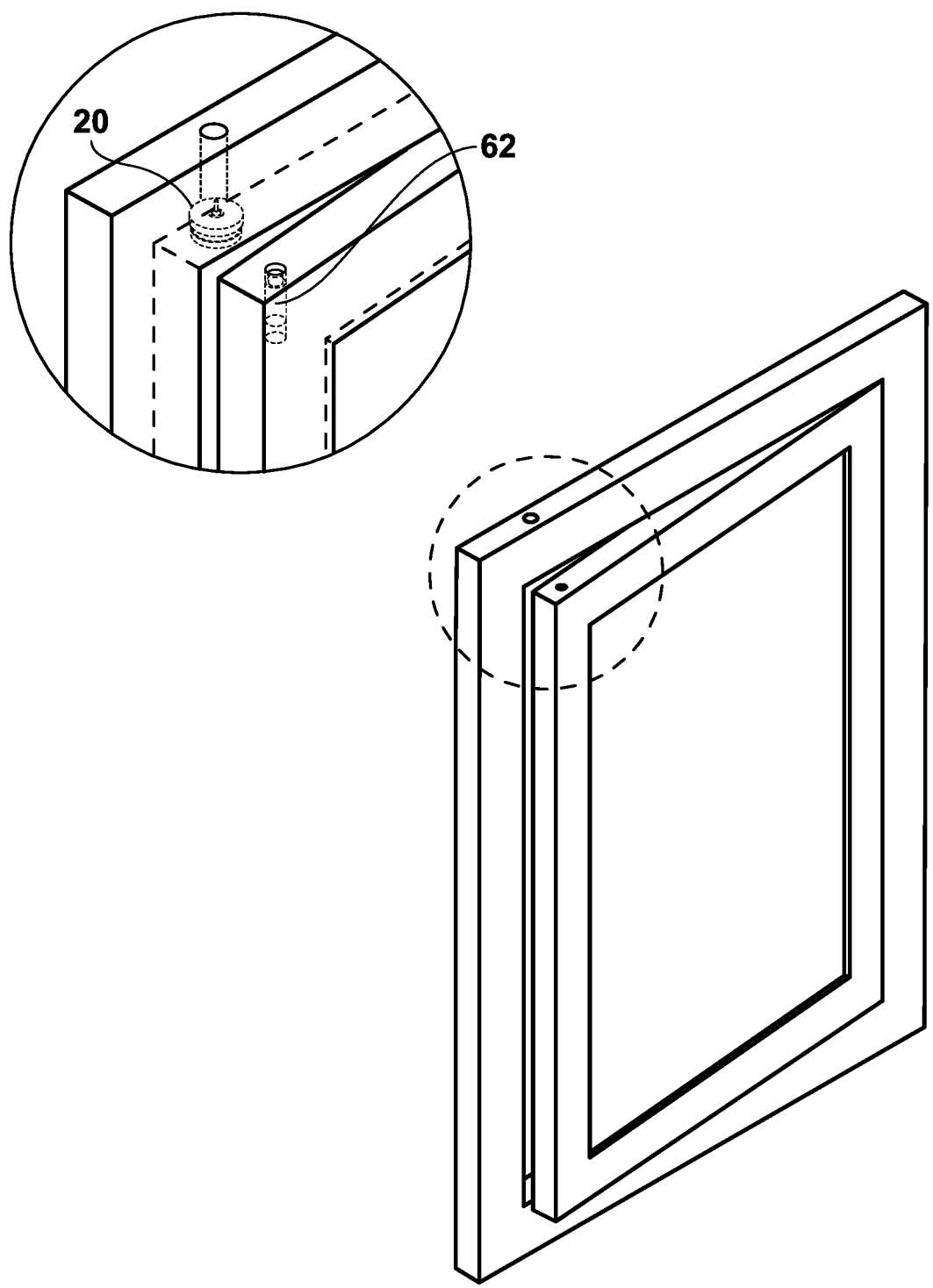
FIG. 17 is an isometric view and enlarged detail view of the mechanical magnetic proximity sensor used in a security application, in accordance with the present invention.

FIG. 17 shows a typical installation, the sensor 20 is installed in the door frame and a plurality of permanent magnets 62 is installed in the door. In FIG. 17 where the door is open, so the permanent magnets 62 is outside of the detection envelope 32, therefore, the Upper Contact Insert 44 and Lower Contact Insert 46 will be open (creating an open circuit), indicating the door is open.

Figure 18:
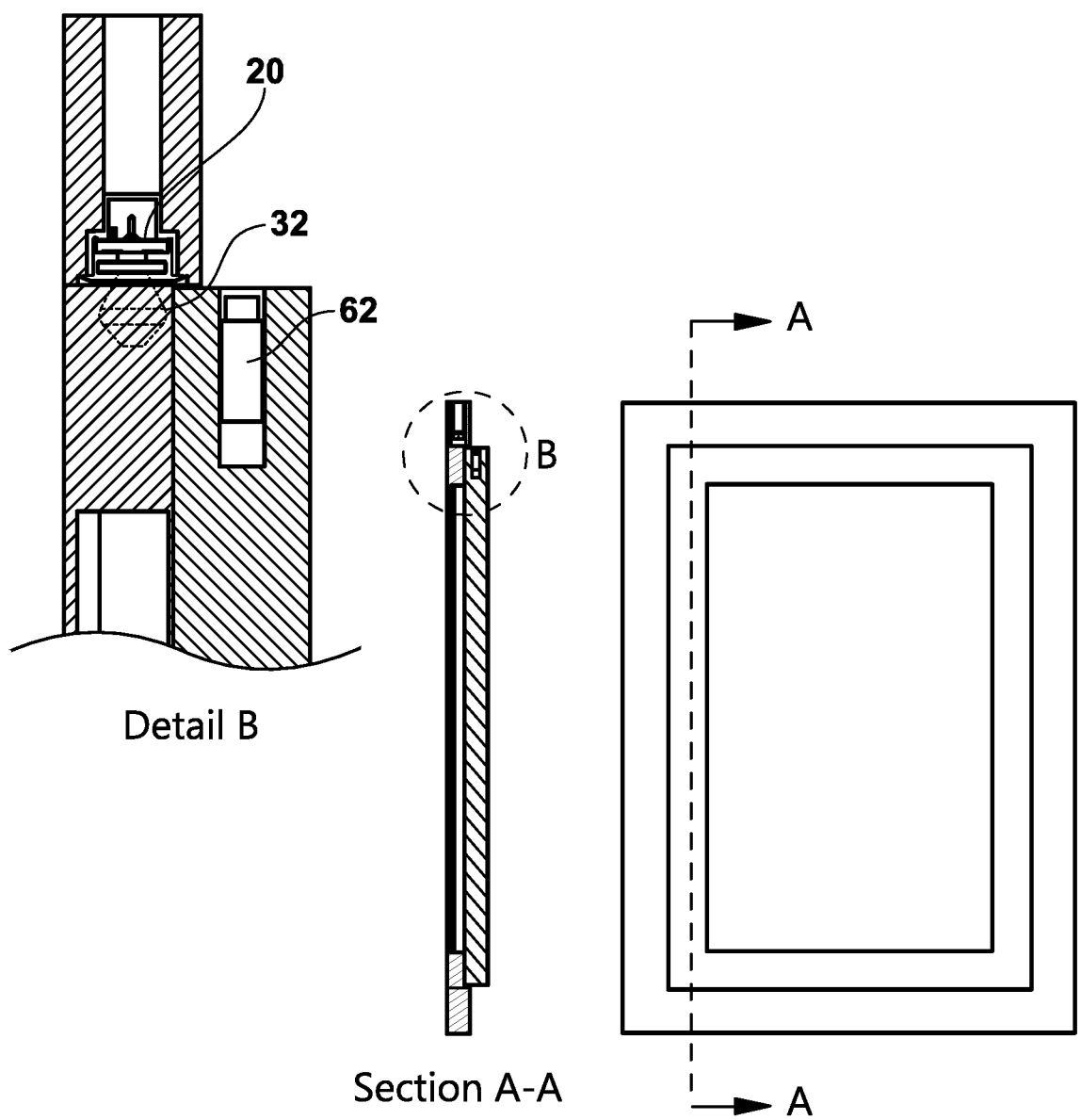
FIG. 18 is a front view, section view and enlarged detailed view of the mechanical magnetic proximity sensor used in a security application, in accordance with the present invention.

FIG. 18 shows the door in the closing position but the permanent magnet 62 is not inside the detection envelope 32, so the Upper Contact Insert 44 and Lower Contact Insert 46 are still open (open circuit), indicating the door is open.

Figure 19:
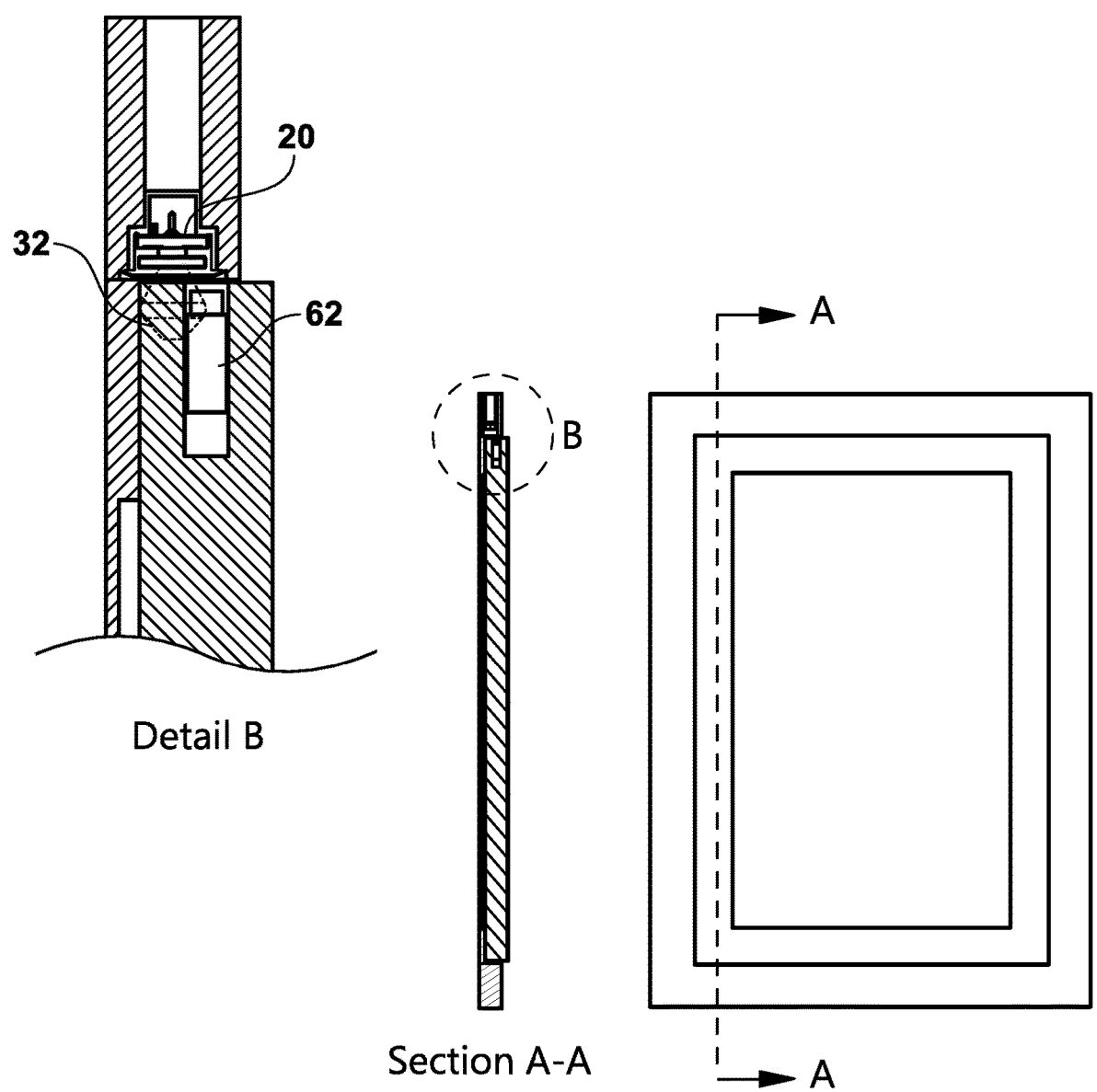
FIG. 19 is a front view, section view and enlarged detailed view of the mechanical magnetic proximity sensor showing the permanent magnet entering the detection envelope, in accordance with the present invention.

FIG. 19 shows the door in the closing position, with the permanent magnet 62 entering the detection envelope 32 but not fully inside the detection envelope 32, so the Upper Contact Insert 44 and Lower Contact Insert 46 are still open (open circuit), indicating the door is open.

Figure 20:
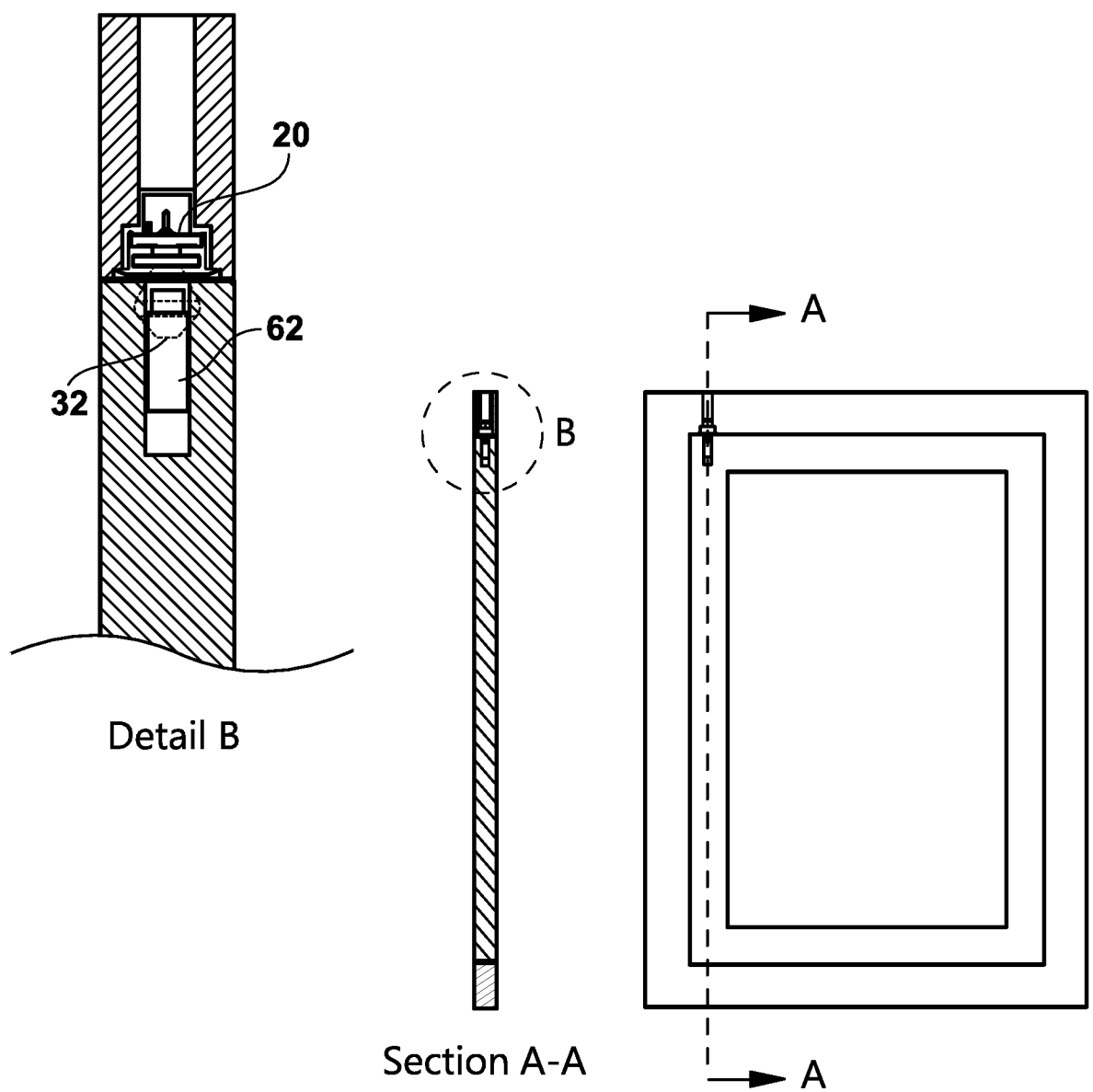
FIG. 20 is a front view, section view and enlarged detailed view of the mechanical magnetic proximity sensor showing the permanent magnet fully inside the detection envelope. The Upper Contact Insert and Lower Contact Insert are closed indicating the door is closed, in accordance with the present invention.

FIG. 20 shows the door in the closed position, with the permanent magnet 62 fully inside the detection envelope 32 so Upper Contact Insert 44 and Lower Contact Insert 46 are closed indicating the door is closed.

Figure 21:
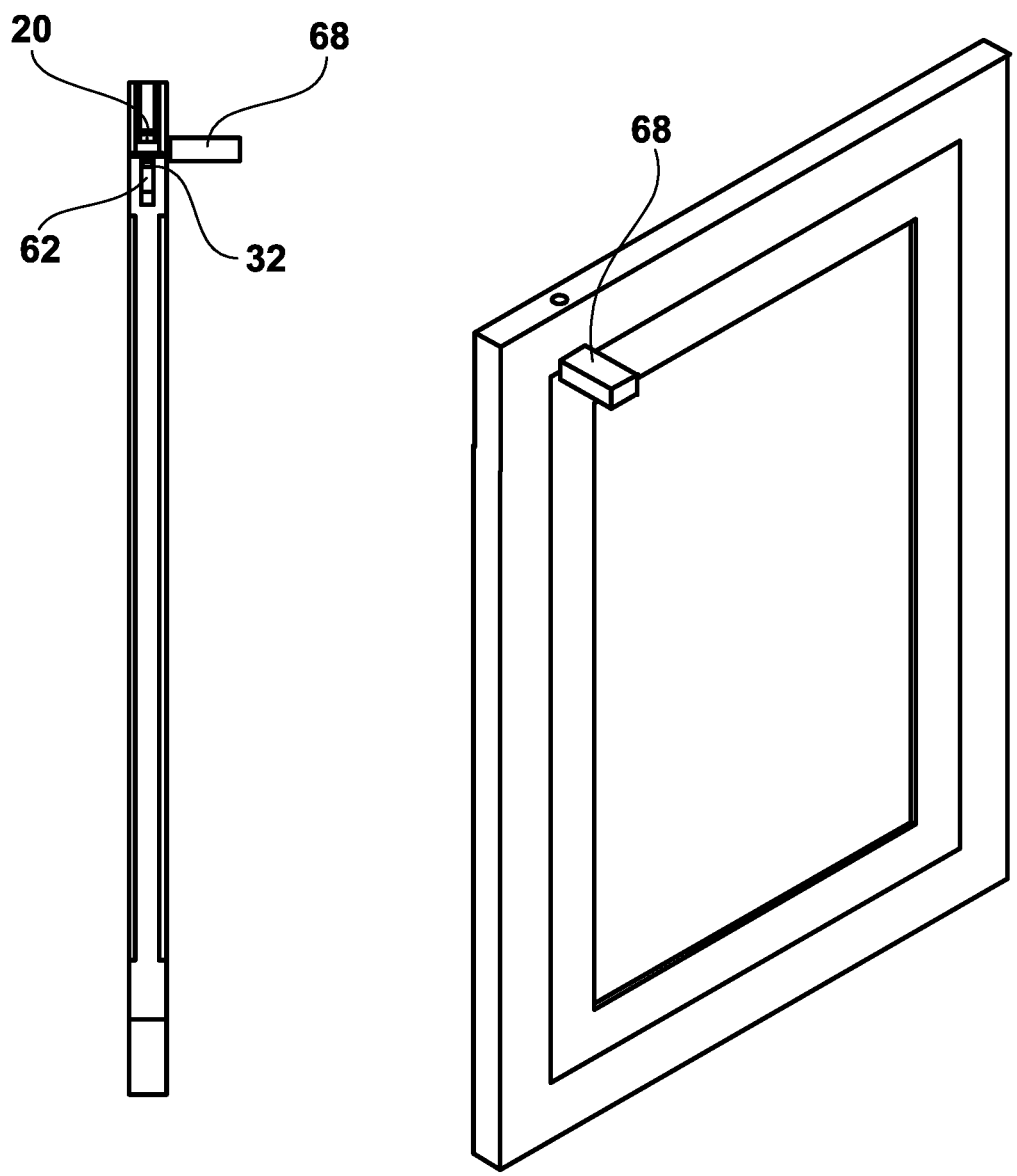
FIG. 21 is an isometric view and side view showing a bypass magnet placed next to the sensor, in accordance with the present invention.

FIG. 21 shows a bypass magnet 64 placed next to the sensor 20. This will cause the core shaft 58 to gimbal or lean as shown in FIGS. 9, 10 and 11. The polarity of the bypass magnet 64 does not matter. If the polarity of the bypass magnet 68 matches the polarity of the sensor magnet 56 in the sensor 20, the force will be repulsive and the core shaft 58 will lean away from the bypass magnet 68 causing the Upper Contact Insert 44 and Lower Contact Insert 46 to open, breaking the circuit and tripping the security system. The same result will occur if the polarities are the opposite, the only difference is the core shaft 58 will lean towards the bypass magnet or an external magnetic object 68. This application illustrates and depends on the key embodiment, "ability to detect two or more, unrelated, inputs", of the current invention sensor 20.

It is well known to those skilled in the art that no material can block or insulate a magnetic field. However, the present invention can shape the response to a magnetic field in a manner similar to a magnetic shield or insulator.

The limits of the detection envelope are set by the internal components of the sensor 20 and the magnetic piece 30. In this simplest embodiment, complement would be a permanent magnet or a magnetically permeable material, e.g. soft iron, nickel-cobalt alloy.

To set or program the shape of the detection envelope the following components can be altered;
For the sensor:
  i. The strength of the sensor magnet 56 can be increased or decreased or the permeability of the reaction element can be increased or decreased,
  ii. The strength of the contact spring 32 can be increased or decreased,
  iii. The length of the core shaft 58 can be increased or decreased,
  iv. The diameter of the fulcrum ring 50 can be increased or decreased.

For the magnetic piece 30, the strength of the permanent magnet can be increased or decreased, or the permeability of the reaction element can be increased or decreased.

In this simple example, the electrical contacts are closed when the sensor and the complement are within the detection envelope and open when the sensor and the complement are outside the detection envelope.

A unique feature of this sensor is that the diameter of the detection envelope in the X-Y plane can be programmed by means of the fulcrum ring. This feature allows a large detection range/distance along the Z-axis and a narrow cone in the X-Y plane. The core shaft and the fulcrum ring form a lever and fulcrum. The core shaft is held in place by the contact spring. This spring provides a gimbal action to the core shaft. At the core shaft leans (gimbals) away from the Z-axis, perpendicular to the X-Y plane, the fulcrum ring will come into contact with the bottom of the contact plate. Any further deviation from perpendicular will cause the fulcrum ring to un-seat the electrical contact from the contact plate and open the electrical circuit.

Another unique feature of this sensor is that it can detect the relative position of several objects. The basic sensor reacts to the complement being inside the detection envelope or outside the detection envelope. Now, if the sensor and complement are aligned so the complement is within the detection envelop, the electrical contacts will be closed. In this state, if an external object (magnet or magnetically permeable material) approaches the sensor in the X-Y plane, this will trigger the gimbal-lever-fulcrum and the electric contacts will be forced open, breaking the electrical circuit. The external object need not approach exactly in the X-Y plane but may approach above or below the X-Y plane—forming another detection envelope in the shape of a toroid or torus, centered about the Z-axis. The truncated cone detection envelope and the toroid/torus detection envelope exist simultaneously but are independent of each other.

I claim:

1. A mechanical proximity sensor, comprising:
   a magnetic piece positioned a distance from a mechanical proximity sensor assembly; wherein the sensor assembly, having:
      a contact plate place on a top of a spring case,
      a sensor magnet is located above a base of a core shaft,
      a ring carrier configured to hold a fulcrum ring and least two electrical contact inserts in the spring case;
      a coaxial retainer is located above the sensor magnet, and
      a contact spring positioned in the space between the sensor magnet and the spring carrier.

2. A mechanical proximity sensor of claim 1, where the sensor magnet is a magnet and the magnetic piece is a magnet.

3. A mechanical proximity sensor of claim 1, where the sensor magnet is a magnet and the magnetic piece is a ferromagnetic material.

4. A mechanical proximity sensor of claim 1, where the sensor magnet is a ferromagnetic material and the magnetic piece is a magnet.

5. A mechanical proximity sensor of claim 1, where the sensor magnet is an electromagnet.

6. A mechanical proximity sensor of claim 1, where the magnetic piece is an electromagnet.

7. A mechanical proximity sensor of claim 1, where both the sensor magnet and the magnetic piece are electromagnets.

8. A mechanical proximity sensor of claim 1, where the contact spring is has a plurality of equally spaced arms around the perimeter of the spring.

9. A mechanical proximity sensor of claim 8, where the arms of the contact spring are equally spaced at 72 degrees apart.

10. A mechanical proximity sensor of claim 1, where the fulcrum ring is supported by a ring carrier.

* * * * *